United States Patent
Tiziani et al.

(10) Patent No.: US 12,322,603 B2
(45) Date of Patent: Jun. 3, 2025

(54) METHOD OF MANUFACTURING SEMICONDUCTOR DEVICES AND CORRESPONDING SEMICONDUCTOR DEVICE

(71) Applicant: STMicroelectronics S.r.l., Agrate Brianza (IT)

(72) Inventors: Roberto Tiziani, Nerviano (IT); Antonio Bellizzi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 452 days.

(21) Appl. No.: 17/824,703

(22) Filed: May 25, 2022

(65) Prior Publication Data
US 2022/0384209 A1    Dec. 1, 2022

(30) Foreign Application Priority Data
Jun. 1, 2021 (IT) .................. 102021000014306

(51) Int. Cl.
*H01L 23/495* (2006.01)
*H01L 21/48* (2006.01)
*H01L 21/56* (2006.01)

(52) U.S. Cl.
CPC ........ *H01L 21/4842* (2013.01); *H01L 21/565* (2013.01); *H01L 23/49558* (2013.01); *H01L 23/49568* (2013.01); *H01L 23/49586* (2013.01)

(58) Field of Classification Search
CPC ............ H01L 21/4842; H01L 21/565; H01L 23/49558; H01L 23/49586
USPC ..................................................... 257/675
See application file for complete search history.

(56) References Cited

U.S. PATENT DOCUMENTS

| | | | |
|---|---|---|---|
| 6,348,363 B1 * | 2/2002 | Chung | H01L 24/48 438/114 |
| 7,504,722 B2 * | 3/2009 | Ochiai | H01L 24/02 257/730 |
| 8,063,488 B2 * | 11/2011 | Itoh | H01L 23/3135 257/E23.116 |

(Continued)

OTHER PUBLICATIONS

IT Search Report and Written Opinion for priority application, IT 102021000014306, report dated Feb. 28, 2022, 8 pgs.

*Primary Examiner* — Nitin Parekh
(74) *Attorney, Agent, or Firm* — CROWE & DUNLEVY LLC (57) ABSTRACT

Semiconductor chips are arranged on an elongated substrate and encapsulated by an insulating encapsulation. Electrically conductive formations and electrically conductive plating lines are plated on the insulating encapsulation using, for example, Laser Direct Structuring (LDS) or Direct Copper Interconnect (DCI) material. The electrically conductive plating lines include first transverse plating lines as well as second plating lines branching out from the first plating lines towards the electrically conductive formations. A first partial cutting step is then performed to form grooves which remove the first plating lines. An insulating material is dispensed in the grooves to encapsulate the end portions of the second plating lines. A second cutting step median along the groove and through the elongate substrate is performed to produce singulated semiconductor devices (such as "die pad up" Quad-Flat No-lead (QFN) packages). End portions of the second plating lines are encapsulated by the insulating material.

11 Claims, 5 Drawing Sheets

(56) References Cited

U.S. PATENT DOCUMENTS

| | | | | |
|---|---|---|---|---|
| 8,129,259 | B2* | 3/2012 | Harayama | H01L 21/561 |
| | | | | 438/33 |
| 8,278,213 | B2* | 10/2012 | Kameyama | H01L 23/481 |
| | | | | 257/E21.597 |
| 2009/0011543 | A1* | 1/2009 | Karta | H01L 21/561 |
| | | | | 257/E23.116 |
| 2009/0079072 | A1* | 3/2009 | Mizusawa | H01L 24/11 |
| | | | | 438/114 |
| 2010/0283129 | A1* | 11/2010 | Tetani | H01L 23/295 |
| | | | | 257/E23.179 |
| 2015/0262918 | A1* | 9/2015 | Tran | H01L 21/78 |
| | | | | 257/676 |
| 2016/0079204 | A1* | 3/2016 | Matsubara | H01L 23/3128 |
| | | | | 438/114 |
| 2016/0307872 | A1 | 10/2016 | Chen et al. | |
| 2019/0214349 | A1 | 7/2019 | Hsu et al. | |
| 2021/0050226 | A1 | 2/2021 | Derai et al. | |

* cited by examiner

METHOD OF MANUFACTURING SEMICONDUCTOR DEVICES AND CORRESPONDING SEMICONDUCTOR DEVICE

PRIORITY CLAIM

This application claims the priority benefit of Italian Application for Patent No. 102021000014306, filed on Jun. 1, 2021, the content of which is hereby incorporated by reference in its entirety to the maximum extent allowable by law.

TECHNICAL FIELD

The description relates to semiconductor devices.

One or more embodiments can be applied, for instance, to Quad-Flat No-lead (QFN) semiconductor devices and other semiconductor devices using Direct Copper Interconnection (DCI) technology.

BACKGROUND

Semiconductor devices manufactured using Direct Copper Interconnection (DCI) technology—oftentimes referred to also as Laser Direct Structuring (LDS) technology—may comprise a "slug-up" or "die-pad-up" package, where conductive patterns structured by laser activation are subsequently plated with conductive materials (copper, for instance) to provide electrically conductive formations such as tracks and pads.

The related plating processes are facilitated by providing plating lines that are finally removed during a singulation step that separates individual devices.

In that way, those plating lines that extend at the locations where cutting is performed for singulation purposes are removed, while remainder portions of plating lines are left exposed at the side walls of the semiconductor device package.

Especially in high-voltage applications, these exposed remainder portions of plating lines may result in undesired creepage distance violations. In this context, "creepage" is a current designation of the phenomenon leading to an undesired current leakage across the surface of an insulating (dielectric) material.

There is a need in the art to address the issues discussed in the foregoing.

SUMMARY

One or more embodiments may relate to a method.

One or more embodiments may relate to a corresponding semiconductor device.

Briefly, one or more embodiments provide a method applicable, for instance, to slug-up QFN packages using DCI technology wherein creepage issues related to portions of plating lines remaining exposed at the package sidewalls are effectively addressed.

In one or more embodiments, plating lines extending at the locations where singulation cutting is performed are removed by partial cutting. The grooves/trenches resulting from such partial cutting are filled with insulating material such as resist material that encapsulates the otherwise exposed plating line portions. The provided encapsulation thus overcomes creepage distance issues by resorting to a solution that is simple to implement at a low cost.

Upon simple visual inspection, semiconductor devices manufactured according to embodiments of the present description exhibit, for instance, electroplated pads with corner inserts formed by (half) trenches filled with insulating material visible at the package flanks.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The references used herein are provided merely for convenience and hence do not define the extent of protection or the scope of the embodiments.

Direct Copper Interconnect (DCI) technology, oftentimes referred to also as Laser Direct Structuring (LDS) technology, has been proposed as a way to replace wire bonding in semiconductor devices such as, for instance, Quad-Flat No-leads (QFN) semiconductor devices.

Documents such as United States Patent Application Publication Nos. 2018/0342453 A1, 2020/0203264 A1, 2020/0321274 A1, 2021/0050226 A1 and 2021/0050299 A1 (all assigned to the assignee of the instant application and incorporated herein by reference) are exemplary of developments in that area.

DCI/LDS technology facilitates replacing wire bonding by providing copper tracks and vias connecting semiconductor chips and associated leadframes.

DCI/LDS technology also facilitates producing "die-pad-up" configurations (that is, with a semiconductor chip or die arranged "face-down" within a device package) with interconnections and leads arranged at the bottom side of the package, with the possibility of dispensing with a conventional leadframe.

A "die-pad-up" configuration facilitates thermal dissipation with the possibility of overcoming thermal management limitations that occur in devices such as QFN devices adopting a conventional "die-pad-down" configuration. For instance, an external heat sink attached on top of a "die-pad-up" arrangement is found to exhibit significantly improved thermal performance.

Whatever the specific details, in DO/LDS technology electrically conductive formations (for instance copper interconnects) are produced by laser beam activation of a laser-activatable molding compound 12 that encapsulates semiconductor dies or chips C arranged on a substrate 10 as visible in figures such as FIGS. 4, 6, 8, 9 and 10.

As discussed, for instance, in the commonly-assigned patent application publication documents cited in the foregoing, laser activation facilitates growing electrically conductive material (such as copper) in a plating process that may involve electroless plating followed by an electrolytic step to produce "thicker" formations having improved electrical conductivity.

Electrically conductive leads thus formed are shown by way of example and designated 14 in the figures.

The plating process is facilitated by the provision of plating lines that connect the various locations where electrically conductive formations are provided in order to act as an anode in (electro)plating processes.

As otherwise conventional in the art, semiconductor devices are usually manufactured arranging a plurality of semiconductor chips C on an elongated, strip-like substrate (intended to provide a so-called "slug", for instance, in the final individual devices) extending in a (first) longitudinal direction x, with the semiconductor chips distributed along the length of the elongated substrate 10.

An insulating encapsulation such as 12 of a laser-activatable material is then provided (molded) onto the semiconductor chips C distributed along the length of the substrate 10.

As a consequence, plating lines as discussed previously are provided running through all the locations where individual semiconductor devices are intended to be produced.

Figure 1:
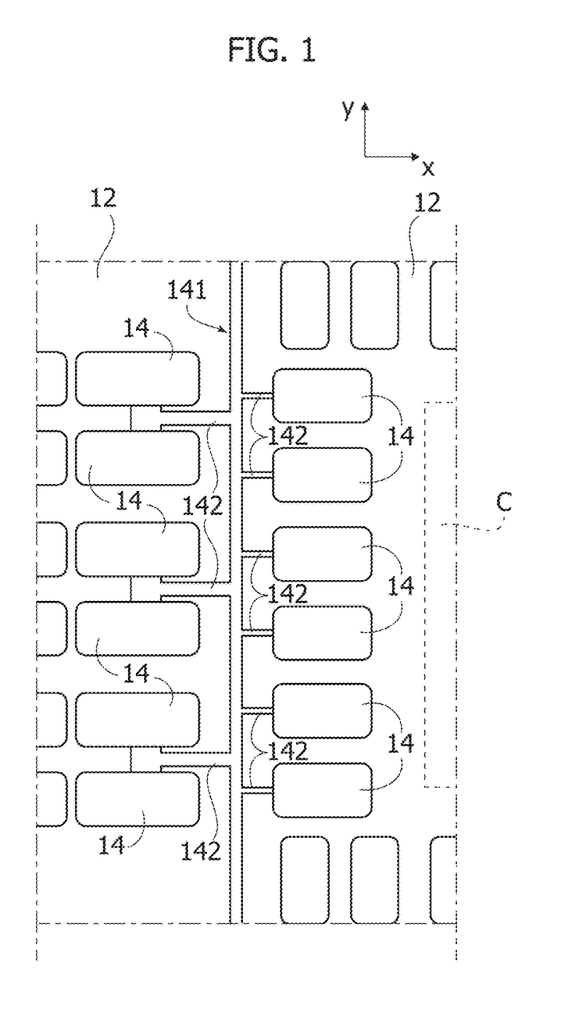
FIG. 1 is a plan view of mutually facing flanks of two semiconductor devices during a manufacturing step prior to a singulation step to produce individual semiconductor devices.

FIG. 1 is a plan view of mutually facing flanks of two semiconductor devices during a manufacturing step prior to a singulation step to produce individual semiconductor devices.

As exemplified in FIG. 1, these plating lines may include: first (primary) plating lines 141 extending across the strip-like substrate 10 in a (second) direction y transverse to the (first) longitudinal direction x, and second (secondary) plating lines 142 that branch out from the first plating lines 141 towards the electrically conductive formations 14.

Figure 2:
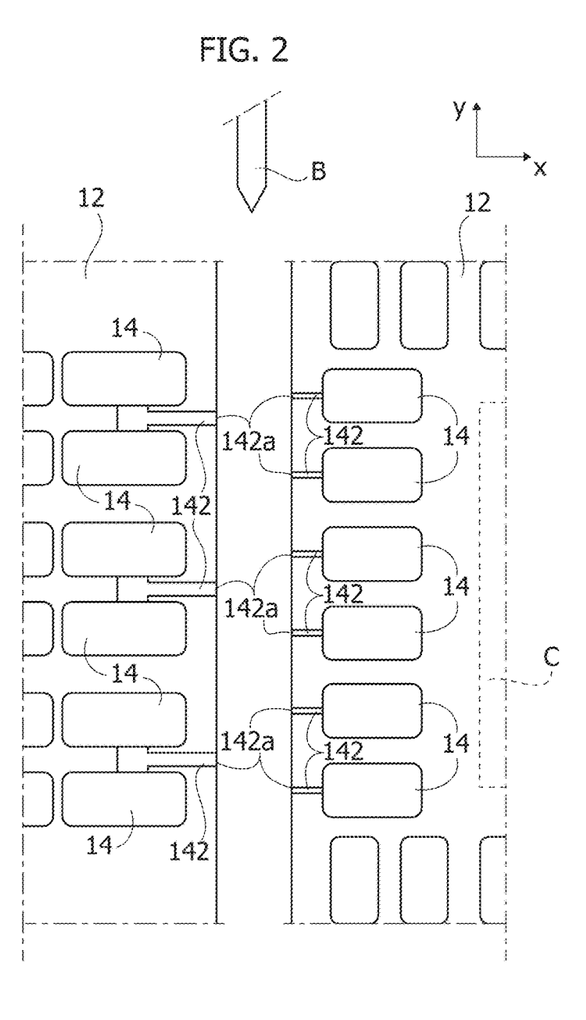
FIG. 2 is a plan view of mutually facing flanks of two semiconductor devices during a manufacturing step after a singulation step to produce individual semiconductor devices.

FIG. 2 is a plan view of mutually facing flanks of two semiconductor devices during a manufacturing step after a singulation step to produce individual semiconductor devices.

FIG. 2 is exemplary of a conventional singulation step where a strip-like substrate having semiconductor chips C distributed thereon and encapsulated in an insulating encapsulation 12 (where electrically conductive formations 14 have been provided) is severed (cut) to produce individual semiconductor devices.

As exemplified in FIG. 2, such a cutting step can be performed (in the direction y transverse to the longitudinal direction x of the substrate) with a singulation blade B that is controlled (in a manner known per se to those of skill in the art) in order to act at the locations where the first plating lines 141 are provided.

In that way, the first plating lines 141 can be removed.

As exemplified in FIG. 2, after package singulation, remainder portions 142a of the second plating lines (that is the "proximal" coupling portions of the second plating lines 142 to the first plating lines 141 located near the first plating lines 141) remain exposed at the flanks of the individual semiconductor devices resulting from the cutting action of the blade B.

These exposed coupling portions 142a are electrically connected to the electrically conductive formations 14. In the case of high-voltage (HV) applications, the exposed coupling portions 142a may have high voltages applied with the risk of creating creepage issues and/or possible short-circuits to circuits and components nearby. A "populated" printed circuit board or PCB and/or an external (electrically conductive) heat sink may be exemplary of these circuits and components.

The problem depicted in connection with FIGS. 1 and 2 can be attempted to be addressed by applying onto the singulated individual devices a thick conformal coating of an electrically-insulating material to cover the coupling portions 142a of the second plating lines 142.

Silicone-based materials applied after PCB mounting may be exemplary of such conformal coating.

Conformal coating can be applied spraying a coating over the entire surface of the device. This may result in a thick electrically-insulating (and likewise thermally-insulating) layer coated on the entire package.

Especially in the case of a "die-pad-up" arrangement, such a coating may adversely affect thermal exchange performance of the device (for instance, heat transfer towards a heatsink). This is because materials suited for use in providing such a conformal coating usually exhibit low thermal conductivity (less than 0.1 W/mC°).

Figure 3:
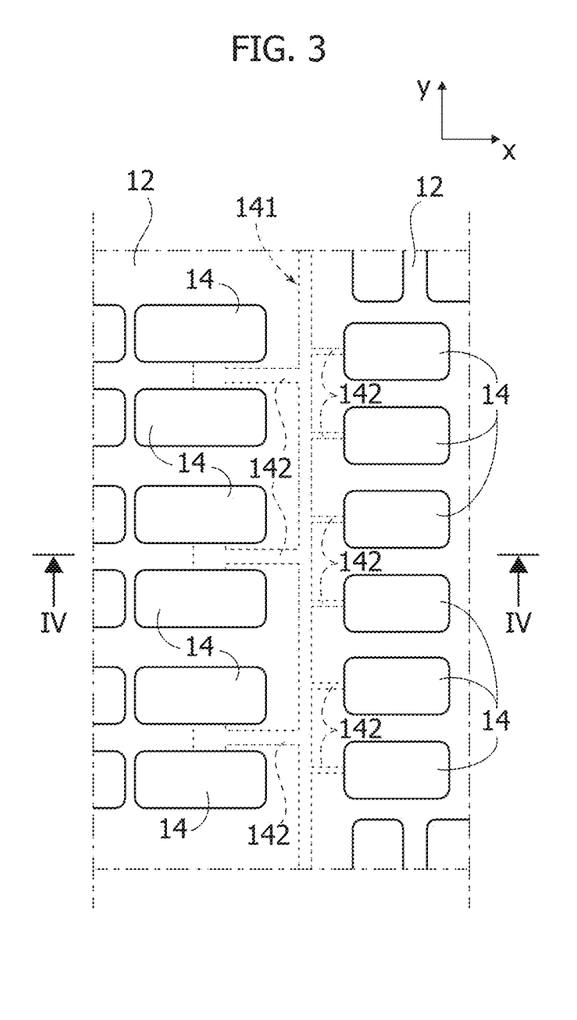
FIG. 3 is a plan view illustrative of a step included in embodiments of the present description.

As exemplified in FIG. 3 and the subsequent figures, an approach as illustrated herein contemplates a two-step cutting process with an intermediate step of encapsulating the exposed coupling portions 142a of the (second) plating lines 142.

Throughout FIGS. 3 to 10, parts or elements like parts or elements already discussed in connection with FIGS. 1 and 2 are indicated with like reference symbols. A detailed description of these parts or elements will not be repeated for brevity.

Figure 4:
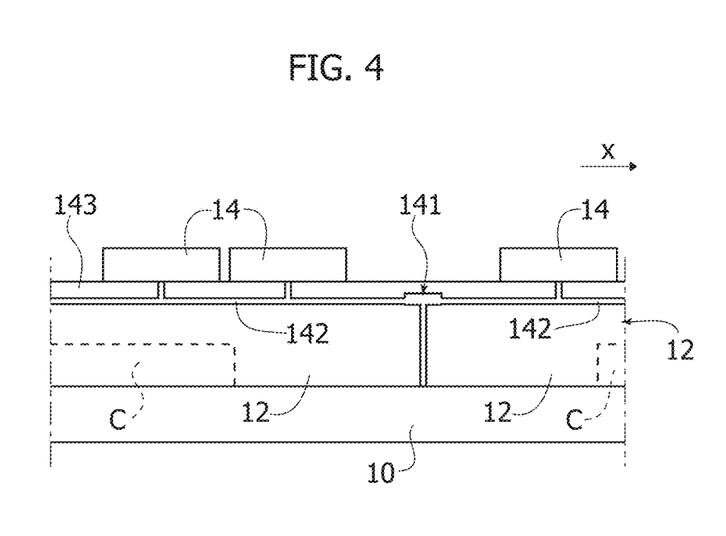
FIG. 4 is a cross-sectional view along line IV-IV FIG. 3.

FIGS. 3 and 4 are representative of a situation essentially similar to the situation illustrated in FIG. 1, namely: a plurality of semiconductor chips C (only two are illustrated for simplicity) distributed along the length of a strip-line elongated substrate 10 extending in a first (longitudinal) direction x, an insulating encapsulation 12 of the plurality of semiconductor chips C on the substrate 10, and electrically conductive formations 14 provided on the insulating encapsulation 12 via plating (e.g., after laser activation or structuring of laser-activatable encapsulation 12).

Again, as illustrated in FIGS. 3 and 4, plating the electrically conductive formations 14 includes forming electrically conductive plating lines that comprise: first plating lines 141 extending in a direction y transverse to the longitudinal direction x of the substrate 10, and second plating lines 142 branching out from the first plating lines 141 towards the electrically conductive formations 14, the second plating lines 142 having (proximal) coupling portions 142a to the first plating lines 141.

As discussed in the foregoing, one or more embodiments can be applied advantageously (yet, non-exclusively) to manufacturing semiconductors devices using CDI/LDS technology wherein (in a manner known per se to those of skill in the art): a laser activatable insulating encapsulation 12 is provided for a plurality of semiconductor chips C on an elongated substrate 10; laser beam energy is applied to structure electrically conductive formations 14 and plating lines 141, 142 in the laser activatable insulating encapsulation 12; and electrically conductive material (copper, for instance) is grown onto the electrically conductive formations 14 and the plating lines 141, 142 structured in the laser-activated insulating encapsulation 12.

FIGS. 4, 6 and 8 to 10 illustrate solutions where the plating lines 141 and 142 all lie on a single level, which otherwise does not represent a mandatory feature.

Also, FIGS. 4, 6 and 8 to 10 detail solutions where, as otherwise conventional in the art, a thin additional encapsulation layer (shown at reference 143) is provided above the plating lines 141, 142 with the aim of covering the plating lines.

Figure 5:
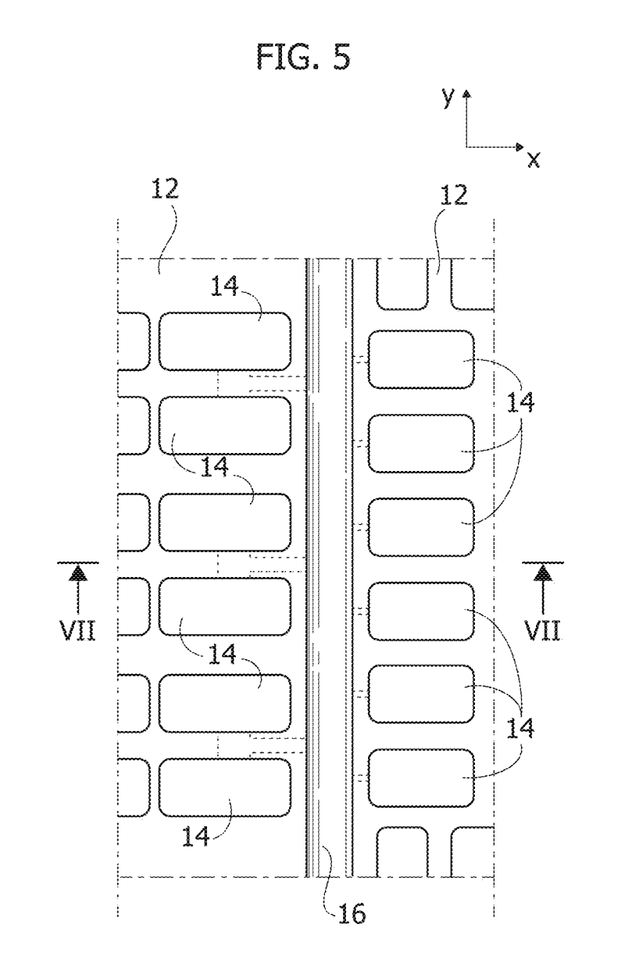
FIG. 5 is a plan view illustrative of a step included in embodiments of the present description.
Figure 6:
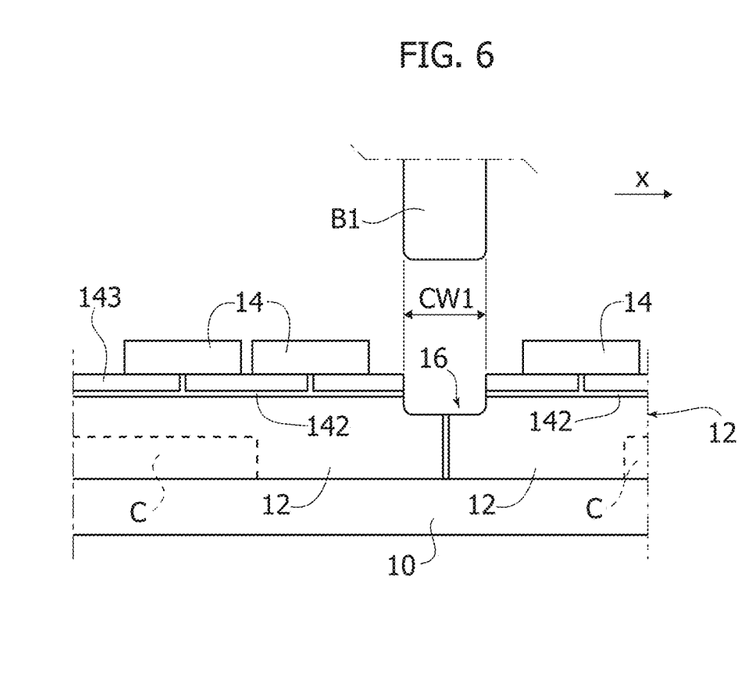
FIG. 6 is a cross-sectional view along line VI-VI of FIG. 5.

As illustrated in FIGS. 5 and 6 a method as illustrated herein comprises a first—partial—cutting step of the elongate substrate 10 having the plurality of semiconductor chips C arranged thereon as well as the insulating encapsulation 12.

In contrast with the conventional singulation step exemplified in FIG. 2 (a single, complete cutting step performed using a blade B having a cutting width of, 325 microns, for instance) the first cutting step exemplified in FIGS. 3 and 4 is a partial cutting step that removes the first plating lines 141 that extend in the direction y transverse to the longitudinal direction x of the substrate 10.

As a result of such partial cutting step, trenches or grooves 16 are formed at the surface of the encapsulation 12 that extend in the direction y, transverse to the direction x of the elongate strip-like substrate 10 having the semiconductor dice C distributed thereon.

The trenches or grooves 16 thus formed have the coupling portions 142a of second plating lines 142 exposed at their (inner) side walls.

Whatever the specific implementation options, the partial cutting step of FIGS. 5 and 6 can be performed by using a "wide" cutting blade B1, that is a blade having a cutting width CW1 of 450 microns, for instance.

Figure 7:
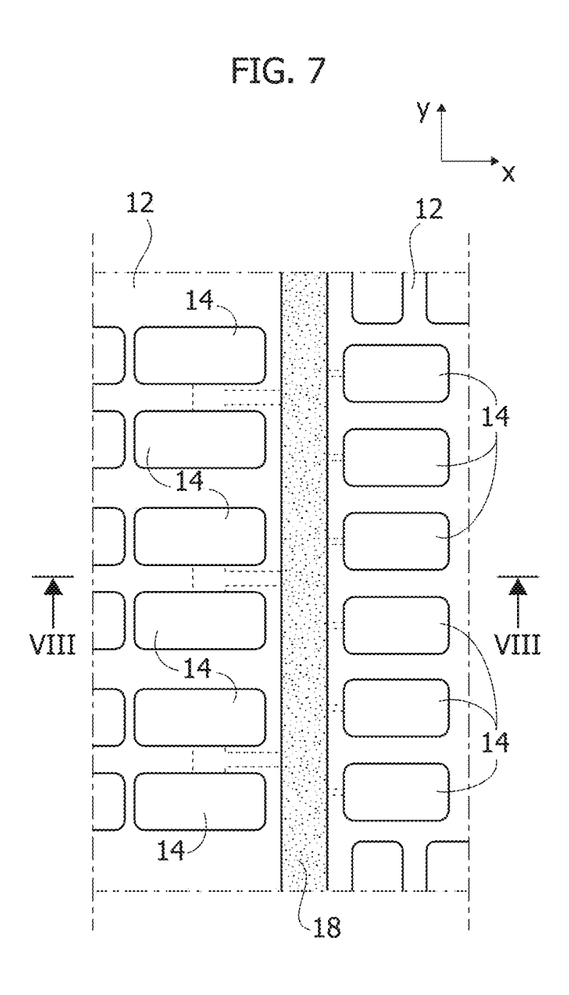
FIG. 7 is a plan view illustrative of a step included in embodiments of the present description.
Figure 8:
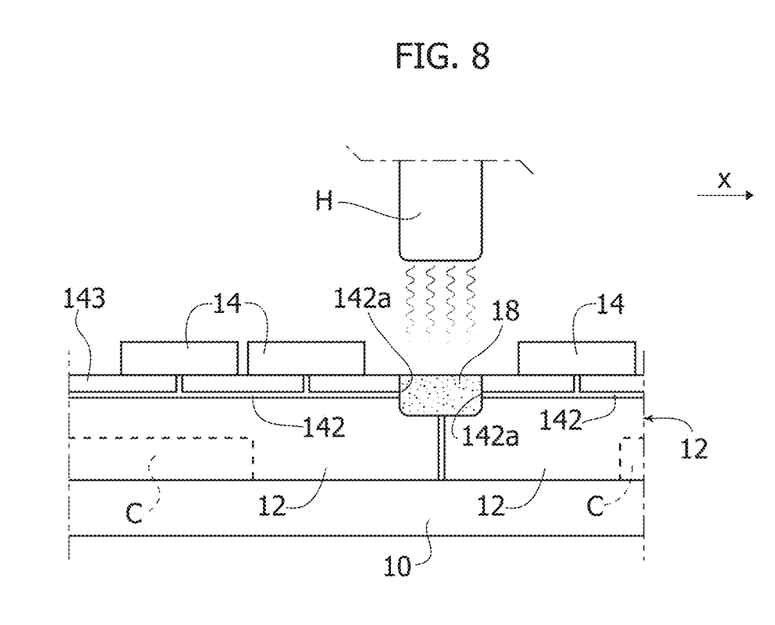
FIG. 8 is a cross-sectional view along line VIII-VIII of FIG. 7.

FIGS. 7 and 8 are exemplary of the possibility of dispensing electrically-insulating material 18 into the trenches or grooves 16 (subsequent to removal of the first plating lines 141).

The insulating material 18 may comprise, for instance, thermoset resin (of any conventional type known in the art, for instance resist material or non-LDS package molding material such as epoxy resin) dispensed into the trenches or grooves 16 in a flowable (molten) state, e.g., via conventional dispensing apparatus, not visible for simplicity.

Figure 9:
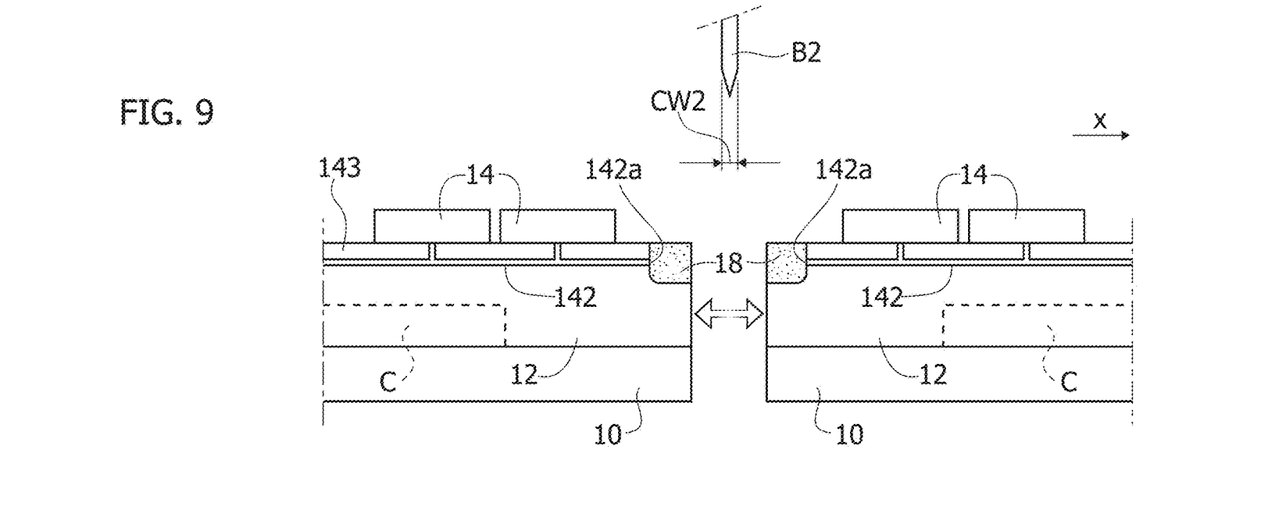
FIG. 9 is a sectional view substantially corresponding to FIG. 8 after a singulation step according to embodiments of the present description.

After solidification of the material 18 (via heat or UV curing, for instance, as represented by H in FIG. 8 and otherwise conventional in the art) singulation of the individual semiconductor devices can then be completed as exemplified in FIG. 9 using a blade B2 having a cutting width CW2 of, for instance, 325 microns.

This may be the same type of cutting blade exemplified as B in FIG. 2.

The blade B2 can be controlled (in a manner known per se to those of skill in the art) to act at an intermediate plane—notionally a median plane—of the trenches or grooves 16 having the insulating material 18 filled and solidified therein.

It is noted that the first partial cutting step of FIGS. 5 and 6 (as performed advantageously with a "wide" blade such as B1) has the effect of removing the first plating lines 141 while leaving the rest of the package substantially intact.

After such a partial (notionally "half") cut, the trenches or grooves 16 are filled with insulating material (resin) 18 that creates (after solidification and final singulation cutting at an intermediate plane of the trenches or grooves 16) an insulating encapsulation of the coupling portions 142a of the second plating lines 142.

This encapsulation insulates the coupling portions 142a from the side flanks of the individual devices 100 that are separated after (final) singulation as exemplified in FIG. 9, thus effectively countering the creepage-related issues discussed in the foregoing.

Figure 10:
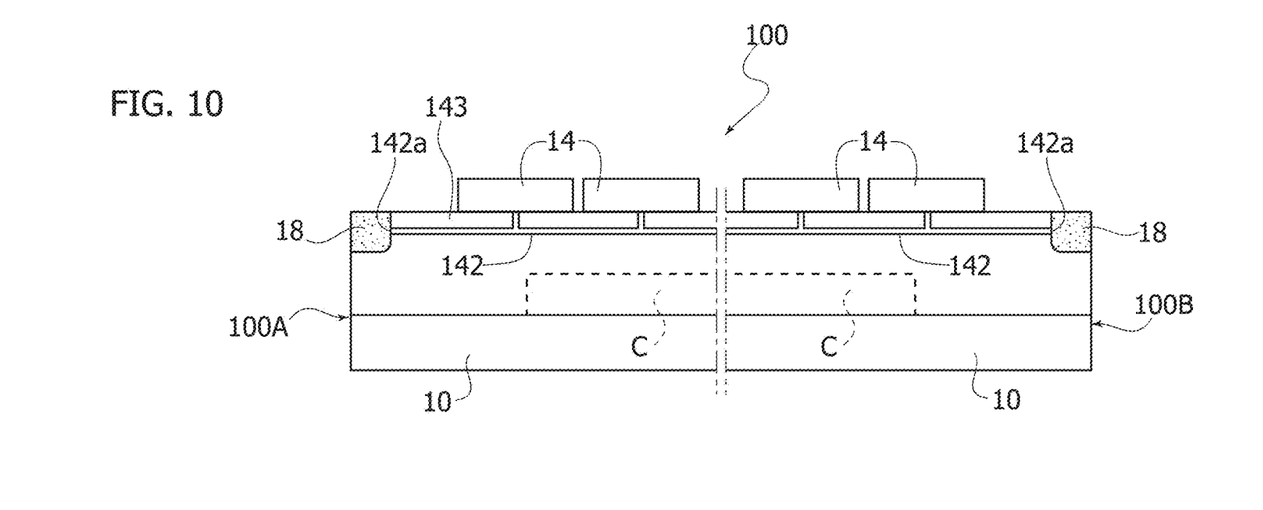
FIG. 10 is a partly broken cross-sectional view across a semiconductor device manufactured according to embodiments of the present description.

As illustrated in FIG. 10, this encapsulation effect can be achieved at any of the flanks 100A, 100B of individual semiconductor device 100 resulting from the (final) singulation step of FIG. 9.

A semiconductor device 100 as illustrated in FIG. 10 thus comprises one (or more) semiconductor chips C arranged on a support substrate ("slug" 10) and encapsulated by an insulating encapsulation 12 having a surface opposite the support substrate 10 with that surface (facing upwards in FIG. 10) having electrically conductive formations 14 plated thereon.

As illustrated in FIG. 10, the device 100 extends in a first direction x between opposed flanks 100A, 100B of the device 100.

These opposed flanks 100A, 100B result from singulation as illustrated in FIG. 9 and thus extend in a second direction, namely y, transverse to the first direction x.

As illustrated in FIG. 10, the opposed flanks 100A, 100B of the device 100 have end (corner) edges at the surface—facing upward in FIG. 10—that has the electrically conductive formations 14 plated thereon.

As visible in FIG. 10, the electrically conductive formations 14 have coupled therewith electrically conductive lines 142 that extend towards the coupling portion edges of the opposed flanks 100A, 100B of the device 100.

As a result of the steps illustrated in FIGS. 5 to 9, electrically-insulating inserts formed by the (solidified) insulating material 18 are provided at the end edges of the opposed flanks 100A, 100B of the device 100.

As visible in FIG. 10, the electrically conductive lines 142 terminate at a distance from the opposed flanks 100A, 100B of the device 100, with the respective coupling portions 142a encapsulated by the electrically-insulating inserts formed by the material 18.

As visible in FIG. 10, the semiconductor chip(s) C can be arranged on the support substrate (or slug, 10) in heat transfer relationship with the support substrate 10 (e.g., lying directly against the support substrate 10).

While represented "upside-down" for simplicity, the arrangement illustrated in FIG. 10 may correspond to the configuration currently referred to as a "die-pad-up" configuration, with the device finally mounted on a PCB, for instance, with the slug 10 facing upwards and the formations 14 facing downwards.

In that way, the electrically conductive formations (leads and/or pads) 14 plated at the surface of the encapsulation 12 opposite the support substrate 10 can be configured to provide electrical connection for the semiconductor chip or chips C arranged the support substrate 10.

The support substrate 10 can be (and currently is) chosen to be thermally conductive (e.g., metal) in order to facilitate dissipation of heat generated during operation of the device 100.

The electrically-insulating inserts 18 provided at the end or corner edges of the opposed flanks 100A, 100B of the device 100 electrically insulate the respective coupling portions 142a of the (second) electrically conductive lines 142 with respect to the opposed flanks 100A, 100B of the device 100.

Without prejudice to the underlying principles, the details and embodiments may vary, even significantly, with respect to what has been described by way of example only without departing from the extent of protection.

The claims are an integral portion of the technical teaching provided herein in respect of the embodiments.

The extent of protection is determined by the annexed claims.

The invention claimed is:

1. A method, comprising:
arranging a plurality of semiconductor chips distributed along a length of an elongated substrate extending in a longitudinal direction;
encapsulating the plurality of semiconductor chips on said elongated substrate with an insulating encapsulation;
forming electrically conductive formations and electrically conductive plating lines on the insulating encapsulation, wherein said electrically conductive plating lines include first plating lines extending in a direction transverse to said longitudinal direction and second plating lines branching out from the first plating lines towards said electrically conductive formations, the second plating lines having coupling portions to the first plating lines;
performing a first cutting step partially into the insulating encapsulation and extending in said direction transverse to said longitudinal direction to form grooves which remove said first plating lines and leave the coupling portions of the second plating lines exposed at side walls of said grooves;
dispensing an insulating material into said grooves to encapsulate the coupling portions of the second plating lines;
performing a second cutting step completely through the insulating material, the insulating encapsulation and the elongated substrate and extending in said direction transverse to said longitudinal direction, the second cutting step performed at an intermediate plane of said grooves to produce singulated semiconductor devices wherein the coupling portions of the second plating lines are encapsulated by said insulating material.

2. The method of claim 1, further comprising solidifying the insulating material dispensed into said grooves prior to performing the second cutting step.

3. The method of claim 1, wherein the insulating material is a thermosetting insulating material, and further comprising solidifying the thermosetting insulating material dispensed into said grooves via exposure to a heat source.

4. The method of claim 1, wherein performing the first cutting step comprises using a first cutting tool having a first cutting width, and wherein performing the second cutting step comprises using a second cutting tool having a second cutting width, wherein the first cutting width is larger than the second cutting width.

5. The method of claim 1, wherein encapsulating the plurality of semiconductor chips comprises:
providing a laser-activatable insulating encapsulation over the plurality of semiconductor chips on said elongated substrate;
applying laser beam energy to structure locations for said an electrically conductive formations and said electrically conductive plating lines in said laser-activatable insulating encapsulation; and
growing electrically conductive material onto the structured locations to form said electrically conductive formations and electrically conductive plating lines.

6. The method of claim 1, further comprising covering the electrically conductive plating lines with an insulating layer, and wherein performing a first cutting step cuts completely through the insulating layer.

7. A method, comprising:
arranging a plurality of semiconductor chips on an elongated substrate;
encapsulating the plurality of semiconductor chips on said elongated substrate with an insulating encapsulation;
forming electrically conductive plating lines on the insulating encapsulation, said electrically conductive plating lines comprising first plating lines extending perpendicular to the elongated substrate at locations between adjacent semiconductor chips of said plurality of semiconductor chips and further comprising second plating lines branching form the first plating line;
performing a first cutting step to remove the first plating lines and portion of the insulating encapsulation under the first plating lines to form grooves between adjacent semiconductor chips of said plurality of semiconductor chips;
dispensing an insulating material into said grooves to encapsulate ends of the second plating lines produced by said first cutting step;
performing a second cutting step passing through and partially removing the insulating material in the grooves and a further portion of the insulating encapsulation to separate the adjacent semiconductor chips of said plurality of semiconductor chips from each other.

8. The method of claim 7, wherein the ends of the second plating lines are exposed at side walls of said grooves.

9. The method of claim 7, wherein performing the first cutting step comprises using a first cutting tool having a first cutting width, and wherein performing the second cutting step comprises using a second cutting tool having a second cutting width, wherein the first cutting width is larger than the second cutting width.

10. The method of claim 7, wherein encapsulating the plurality of semiconductor chips comprises:
providing a laser-activatable insulating encapsulation over the plurality of semiconductor chips on said elongated substrate;
applying laser beam energy to structure locations for said electrically conductive plating lines in said laser-activatable insulating encapsulation; and growing an electrically conductive material onto the structured locations to form said electrically conductive plating lines.

11. The method of claim 7, further comprising covering the electrically conductive plating lines with an insulating layer, and wherein performing a first cutting step cuts completely through the insulating layer.

* * * * *